United States Patent [19]

Gu et al.

[11] Patent Number: 5,552,979
[45] Date of Patent: Sep. 3, 1996

[54] ISOLATED CURRENT SENSOR FOR DC TO HIGH FREQUENCY APPLICATIONS

[75] Inventors: Wen-Jian Gu, Croton-on-Hudson, N.Y.; Gregory T. DiVincenzo, Easton, Md.; Paulo P. Caldeira, Scarsdale, N.Y.

[73] Assignee: Philips Electronics North America Corporation, New York, N.Y.

[21] Appl. No.: 159,394

[22] Filed: Nov. 30, 1993

[51] Int. Cl.⁶ ............... H02M 3/24; G01R 33/00
[52] U.S. Cl. ..................... 363/98; 324/117 R
[58] Field of Search ............... 363/17, 98, 132; 324/98, 99 R, 101, 117 R, 127

[56] References Cited

U.S. PATENT DOCUMENTS

| | | | |
|---|---|---|---|
| 4,276,510 | 6/1981 | Tompkins et al. | 324/127 |
| 4,584,635 | 4/1986 | MacInnis et al. | 363/25 |
| 4,899,103 | 2/1990 | Katzenstein | 324/99 R |
| 4,914,383 | 4/1990 | Wilkerson | 324/127 |
| 5,053,695 | 11/1991 | Canter | 324/117 R |
| 5,196,784 | 3/1993 | Estes Jr. | 324/117 R |
| 5,327,789 | 7/1994 | Nijdam | 73/861.56 |

OTHER PUBLICATIONS

IEEE Transactions on Power Electronics, vol. 8, No. 1, Jan. 1993 "Magnetic Current Sensors for Space Station Freedom" by Craig Sullender, pp. 69–75.

IEEE Transactions on Magnetics, vol. 24, No. 6, Nov. 1988, "Current Sensors with a Small Saturable Core and MOSFETS" by K. Harada & H. Sakamoto, pp. 2910–2912.

Primary Examiner—Matthew V. Nguyen
Attorney, Agent, or Firm—Bernard Franzblau; David R. Treacy

[57] ABSTRACT

Current in a line is measured by passing it through a coil, having at least one turn, linking a small high permeability core; passing a measuring current through a bucking winding around the same core; and controlling the measuring current to buck the magnetomotive force of the line current so that the core flux stays below the saturation level. The measuring current may flow through a precision resistor so that a voltage across the resistor is an accurate measure of the line current. The measuring current is obtained from a high frequency switching circuit which senses the change of flux in the core. In normal operation the circuit switches when the core flux has risen to a predetermined value, such as 60% or 80% of the saturation value. If drift or extreme transients cause the flux to reach the saturation level, a sensing and correction circuit re-establishes operation between the desired points.

25 Claims, 6 Drawing Sheets

5,552,979

ISOLATED CURRENT SENSOR FOR DC TO HIGH FREQUENCY APPLICATIONS

BACKGROUND OF THE INVENTION

1. Field of the Invention

The invention relates to devices and circuits for "non-contacting" measurement of current, whose output is an electrical signal which is isolated electrically from the conductor whose current is being sensed; and more particularly to such a sensor which does not require complex temperature compensation or expensive, critical semiconductor or magnetic components.

A very simple device of this type is the so-called current transformer, which has a transformer core with a line current winding and a secondary winding. The secondary winding is terminated with a low value resistance, so that the impedance seen from the line is very small. Usually the primary has only a few turns, or may simply consist of an insulated length of line conductor passing through a core opening and functioning as one turn. Providing a sufficient insulation of the primary coil so that breakdown voltage is high, and leakage currents between primary and secondary are negligibly small, is fairly easy; and such a transformer is relatively unaffected by temperature extremes, is extremely stable, and has a very accurately known current ratio so long as the flux level in the core does not approach saturation. However, after an initial transient, DC components in the line current are not mirrored by a corresponding component in the secondary; measurement of very low frequencies requires a large core; and relatively low values of direct current components in the line current (of the order of magnitude of the peak of typical exciting current) will cause the core to saturate sufficiently for at least a part of each AC cycle so that even the AC components are no longer accurately mirrored by the voltage across the secondary winding.

If a current sensor is to be used as a trip signal source in a circuit breaker, so that ratings are easily changed, it is desirable that the sensor operate down to DC even when the power source is AC. It further is desirable that an electronic trip breaker can be rated for DC operation, and accurate measurement of DC is then mandatory. For such applications, or any in which DC or very low frequencies are involved, other types of non-contacting current sensor are then required.

2. Description of the Prior Art

A known type of current sensor, which is operable down to DC, uses Hall Effect sensors. However, these devices are relatively temperature sensitive and position sensitive, and can require expensive calibration if high accuracy is required, such as when comparing currents in two different conductors.

A still more recent development involves an active current-balancing circuit, which uses a transformer core which is driven between saturation flux values by a high frequency alternating current. Such a device is described by K. Harada and H. Sakamoto in "Current Sensors with a Small Saturable Core and Mosfets", IEEE Transactions on Magnetics, vol. 24, no. 6 (November 1988). This device balances the effect of a current in a line coil with a bucking current flowing in an opposite direction through a bucking coil and through a measuring resistor. The bucking current has a value which is exactly related to the line current by the turns ratio of these coils, down to DC. In addition, a high frequency magnetizing/switching current flows through the bucking coil and measuring resistor in response to the alternate application of opposite polarity voltages from a switching circuit.

The circuit described in this article uses a Permalloy 80 core, which has high permeability up to a certain flux, and then exhibits a very sharp saturation. A secondary coil provides a trigger voltage to the switching circuit, which is a so-called transistor core multivibrator.

Two complementary field effect transistors have their source terminals connected to one end of the bucking coil and their drain terminals respectively connected to positive and negative power supplies. Their gate terminals are connected together and to the secondary coil to cause the transistors to conduct alternately. When one transistor is conducting, a constant voltage is applied to the bucking winding, and flux and magnetizing current through the bucking coil rise linearly. The secondary coil is connected such that the voltage applied to the gate, due to the linearly rising flux in the core, holds the transistor on until the core saturates. Upon core saturation there is a sudden increase, or spike, in the current through that transistor. Because of the circuit design and the inter-terminal capacitances of the transistors, the current spike causes the FET's to be switched, cutting off the one transistor which had been conducting.

Upon switching, current flow cannot stop instantaneously, so it continues through the reverse diode associated with the other transistor. The spike current falls rapidly until the core is no longer saturated. The magnetizing current then continues to fall linearly to zero, and rises linearly in the opposite direction through the other transistor. When the core reaches opposite saturation, and there is an opposite current spike, switching occurs again. Thus, a very small generally triangular current, with large spikes at each peak, flows at a switching frequency determined by the core size and characteristics, the number of bucking coil turns, and the supply voltages.

When the line current is negligible, this high frequency current is the only current component flowing through the bucking coil, and transistor switching is symmetrical. When the line current is substantial, the voltage across the measuring resistor due to the measuring current affects the speed of the generally linear changes of current as a function of the polarity of the change, so that transistor switching becomes repeatably asymmetric.

The Harada/Sakamoto circuit has the advantage that it is effective down to DC. However, line current components at frequencies which are a significant fraction of the switching frequency cannot be accurately detected because of the filtering which is required to reduce the effect of the current spikes on any circuit connected to receive the voltage across the measuring resistor. The large current spikes are, themselves, a potential source of electromagnetic interference with other circuits or systems. In addition, the circuit cost is undesirably high because of the need for a sharply saturating core which must be wound from metal tape.

SUMMARY OF THE INVENTION

An object of the invention is to measure current with a non-contacting electronic/magnetic sensor which does not generate saturation current spikes.

Another object of the invention is to measure current components accurately from DC to high frequencies.

A further object of the invention is to provide a current sensor which can use an inexpensive magnetic core.

Yet another object of the invention is to provide a current sensor which is unaffected by normal temperature variations and long term drift of electronic circuitry.

According to the invention, the current to be measured is passed through a line current winding of a relatively small transformer core. In this specification and claims, a line conductor passing through a core opening shall be considered as a coil having one turn on the core. The core may be of any material which has a very high permeability at low flux levels. A measuring current having bucking and magnetizing components passes through a bucking winding on the same core. The magnetizing current component results from the alternate application of opposite polarity voltages from a high frequency switched circuit. A control circuit reverses the switched circuit whenever the change of core flux reaches preset limits less than the saturation flux value for the core.

Like the sensor described by Harada and Sakamoto, the bucking current component has a value which is exactly related to the line current by the turns ratios of these coils, down to DC. However, because flux in the core is maintained small, within the linear region, an expensive sharply saturating core is not required.

The measuring current flows through a measuring resistor, whose voltage is sensed as a measure of the line current. Because the magnetizing current component is free from spikes, there is no electromagnetic interference and filtering is not required. As a result there is no loss of high frequency response.

Preferably the control circuit senses a voltage proportional to the rate of change of the core flux. This voltage is provided to an integrator, whose output is one input to a comparator circuit. The comparator circuit compares the integrator output to a reference voltage and provides a pulse whenever the flux change reaches a preset limit. The pulse causes a bistable circuit to change state, thereby changing the polarity of voltage applied by a switching transistor circuit to the bucking winding and measuring resistor.

In a first preferred embodiment of the invention, a voltage proportional to the rate of flux change is rectified before being integrated. The integrator output is reset to zero each time the comparator sends a pulse to the bi-stable circuit.

In a low cost form of this embodiment, useful where there will be no DC or extremely low frequency components of line current, rectification of the voltage is performed by connecting the two ends of the bucking coil to the respective inputs of a common diode bridge rectifier. The rectifier outputs are connected to inputs of an ordinary differential operational amplifier. The amplifier output is connected to an RC integrator circuit connected to the feedback path around a second op-amp.

In a preferred second form of this embodiment, full accuracy is obtained even with DC or very low frequency line current components. A secondary winding is provided on the transformer, and the voltage across this secondary winding is integrated. None of the measuring current flows through this secondary winding.

The bistable circuit is preferably a conventional flip-flop. The complementary outputs may be connected through driver circuitry to the gates of complementary transistors; or, depending on the transistor arrangement, one output may be directly connected to these gates.

In another embodiment of the invention, the secondary winding voltage, without rectification, is integrated in a balanced integrator whose output is compared to preset positive and negative limits. The bistable circuit is switched whenever the limits are reached.

In all of these embodiments, because the core is kept from saturating, no spikes appear in the voltage across the measuring resistor, and high frequency filtering is not required. Excellent frequency response is thus obtainable.

According to a further preferred embodiment of the invention, the device also includes a saturation detector which senses an effect, such as a sharp increase in the magnetizing current, if the core flux ever reaches the saturation level. This can occur if a major electrical transient exceeds the ability of the circuit to follow the line current, or if minor unbalance or long-term drift in a signal rectifier circuit or integrator or other components accumulates a small low frequency or DC error. The result of drift is that flux, which still varies over the preset total range, is no longer centered about the desired average value. When this drift (flux offset) reaches the point that at least one high frequency cycle enters the flux saturation region of the core, the voltage driver is immediately switched, even though the integrator output has not yet reached the preset limit.

Still more preferably, upon detection of saturation a small correcting value is added in the control circuit, so that operation is returned to a balanced swing about the desired average value.

DESCRIPTION OF THE PREFERRED EMBODIMENT

Figure 1:
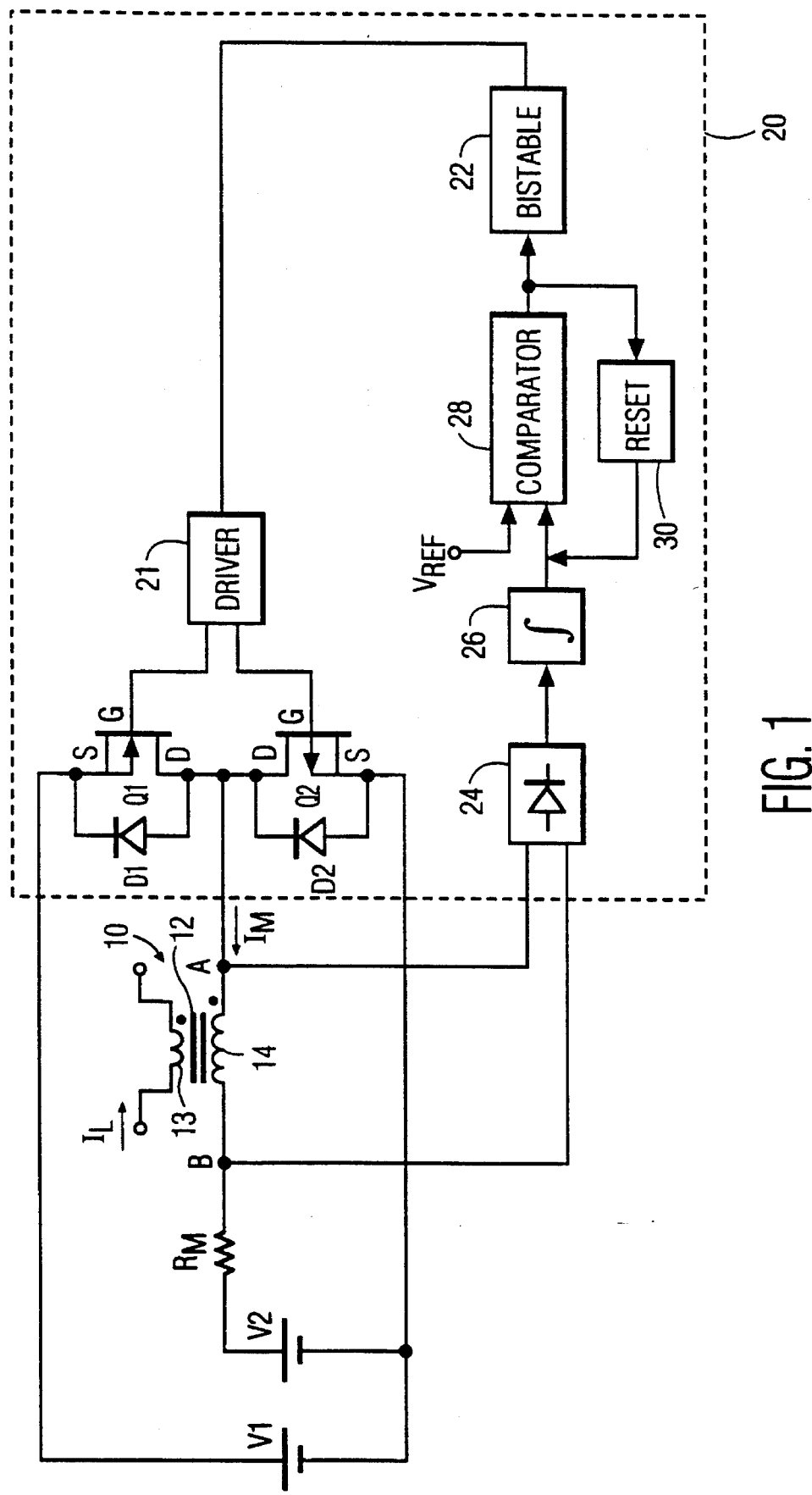
FIG. 1 is a simplified schematic diagram of a sensor according to the invention.
Figure 2:
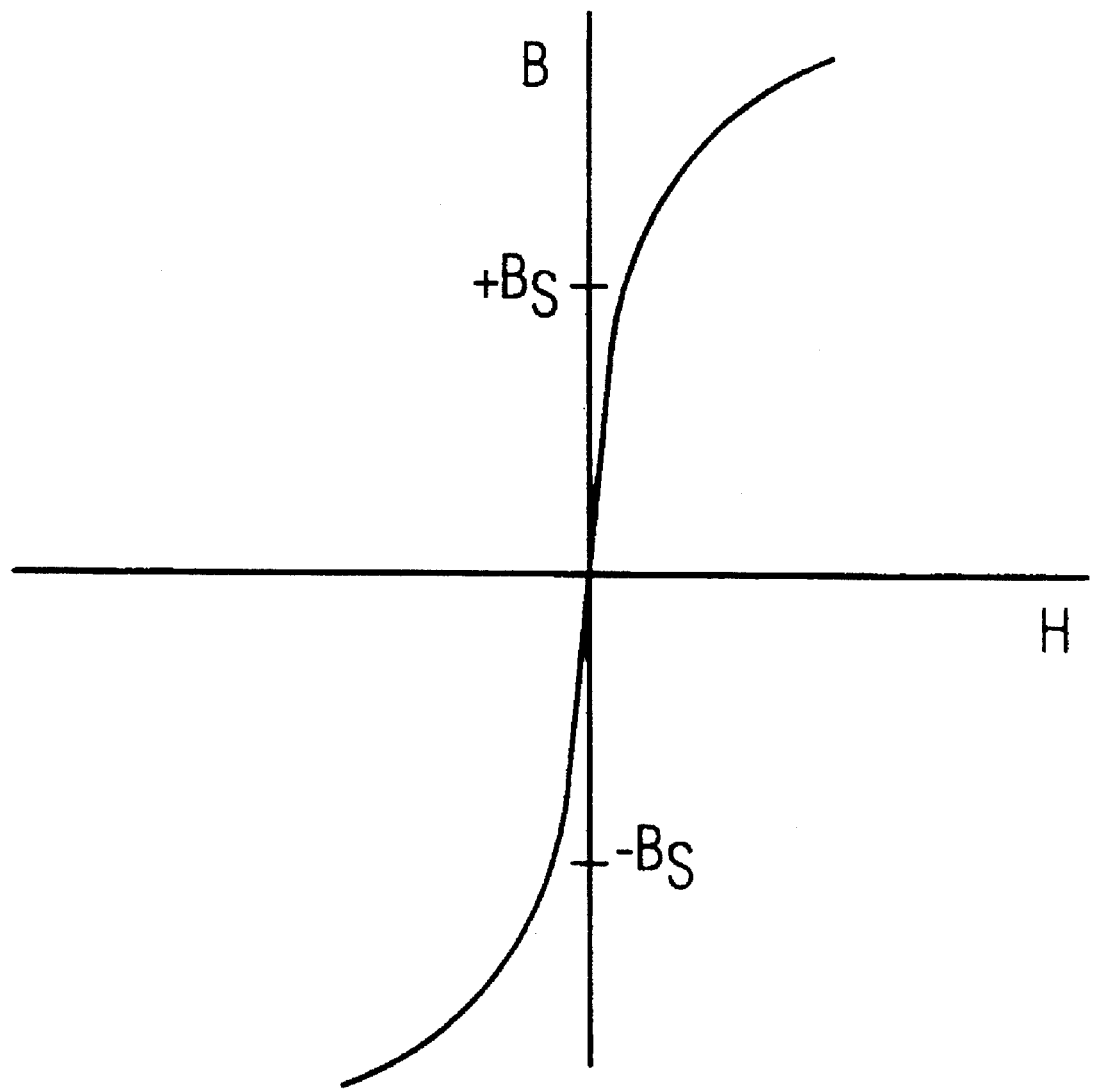
FIG. 2 is an idealized B-H diagram of a core material suitable for use in the invention.

The circuit of FIG. 1 shows the principle of the invention. A transformer 10 includes a core 12 having a B-H curve like the idealized shape shown in FIG. 2. Over a magnetic flux range of $\pm B_s$ the core has a high permeability. This core carries an $N_L$ turn line current winding 13, and an $N_B$ turn bucking winding 14. A measuring resistor $R_M$ is connected in series between a lower voltage supply V2 and the bucking winding 14. A sensing/driving circuit 20, which includes a pair of transistors Q1 and Q2 and control circuitry for switching them, is connected to the two terminals of the bucking winding 14 and to the circuit ground. Measuring current $I_M$ flows in series through the bucking winding 14, the measuring resistor $R_M$, and the lower voltage supply V2. The transistors Q1 and Q2 are complementary field-effect transistors connected in series across a higher voltage supply V1, and include respective reverse diodes D1 and D2. To provide balanced operation, V1=2V2.

Transistor Q1 is a p-channel transistor having its source terminal connected to the positive terminal of power supply $V_1$, and transistor Q2 is an n-channel transistor having its source terminal connected to the negative terminal of power supply $V_1$. The drain terminals are connected to each other and to the bucking winding at a node A. The respective gate terminals of the transistors are connected together and to a driver circuit 21 which receives control signals from a bistable circuit 22.

The voltage across the bucking winding 14 appears between the node A and a node B between the winding 14 and the measuring resistor. These two nodes are connected to the input of a rectifier circuit 24, whose output is connected to an integrator circuit 26. The integrator output is connected to one input of a comparator 28 whose other input is connected to a reference voltage $V_{REF}$. The output of the comparator is connected to the input of the bistable circuit 22, and to a reset circuit 30 which is connected to the integrator 26 output.

Operation

In the following analysis, these symbols are used:
$I_L$ Line current.
$I_M$ Total current through the measuring resistor $R_M$.
$I_B$ Induced current in the bucking coil.
$V_A$ Voltage at node A.
$V_{DS1}$, $V_{DS2}$ Voltage drop across the conducting transistor.
$V_{D1}$, $V_{D2}$ Voltage drop across the conducting reverse diode.

The basic principle of the circuit is that, when there is any change in the line current, this change causes a corresponding change in the bucking current. When the bucking current is significant, there will be a significant difference between the on times of the two transistors. The polarity of a voltage, applied to the series combination of bucking coil and measuring resistor, is reversed at a high switching frequency.

When the circuit is first energized, the output of bistable circuit 22 determines which of the two transistors will conduct. A substantially constant voltage is then applied to the node A causing flux to increase in the core, and an increasing magnetizing current to flow through the bucking coil (positively or negatively) until the integrator output reaches the reference value. At the same time, if line current is rising the bucking current will rise, such that $I_B=(N_L/N_B)I_L$. This causes the flux in the core to correspond solely to the integral of the voltage induced in the winding; unless the voltage across the measuring resistor $R_M$ is significant, the induced voltage will be equal and opposite to $V_A$.

The output of the rectifier 24 is the absolute value of the induced voltage in the bucking winding. Its integral, then, is a value proportional to the absolute value of the flux in the core. The voltage $V_{REF}$ applied to the comparator 28 is set at a value corresponding to a predetermined fraction of the saturation flux value, such as 60%. When the integrator output voltage reaches this level, a pulse will be provided to the bistable circuit 22, causing the bistable circuit to switch to the other state. This will cause the one transistor to turn off, and the other to be turned on, so that the voltage $V_A$ changes polarity. At the same time, the comparator pulse is applied to the reset circuit 30, resetting the integrator output to zero.

The flux in the core 12, and the magnetizing current through the bucking coil 14, will then fall. The induced voltage, now opposite in polarity to that obtained during the previous half cycle, will be applied to the rectifier 24. The rectifier output will have the same polarity as before, so the output of the integrator 26 will rise again. The integrator output will reach the value $V_{REF}$ just as the core flux and magnetizing current are zero, and the comparator will again provide a pulse. This pulse resets the integrator output to zero and triggers the bistable circuit 22, which changes back to the original state, turning the one transistor back on, and the other off.

The above cycle of operation will continue, with flux rising to the predetermined limit, and decreasing to zero, and rising again. The polarity of the flux is dependent only on the polarity initially taken by the bistable circuit. It should be noted that the pulse from the comparator need not reset the integrator output exactly to zero. If reset is to a small but repeatable value no inaccuracy results, because this will affect each succeeding half cycle identically; the only effect will be that switching occurs at a different flux value.

If a line current flows, an equivalent bucking current will flow through the bucking coil and measuring resistor. If the line current is "significant" the bucking current will be greater than the peak value of the magnetizing current, so that instantaneous total or measuring current flow may be in the opposite direction, merely rising and falling slightly because of the voltage switching. There will be no change in the polarity or range of flux change; but for large line and bucking currents, the rate of change may be far greater in one direction than the other, with a correspondingly shorter time in which the transistors are switched in that state.

Those familiar with semiconductor circuits will recognize that, depending on the voltages applied to the gates of the transistors and the direction of total current flow through the bucking winding, the voltage $V_A$ at node A normally has one of four values: V1+$V_{D1}$, V1–$V_{DS1}$, –$V_{D2}$, or +$V_{DS2}$. For rigorous analysis of the rate of rise and fall of magnetizing current, the voltage drops through the transistors and reverse diodes should be taken into account because they have opposite effects; that is, when current is flowing through a reverse diode, the absolute value of voltage ($V_A$-$V_2$) is greater than when current flow is through one of the transistors. This causes the core flux and the magnetizing current component to change slightly more rapidly in one direction than in the other direction. However, the principle of operation of the circuit may be fully described and understood without including the effect of these voltage drops.

The effect of bucking current on the time of switching of the circuit shown in FIG. 1 may be easily seen by considering the case in which the voltage across the measuring resistor is 80% of the available driving voltage; that is, $I_B R_M$=0.8 V2. (Note that, as stated above, V1=2V2). When Q1 is switched on, ($V_A$–$V_B$)=0.2V2 (ignoring the transistor voltage drop, which is in the direction of reducing $V_A$ slightly). When Q1 is switched off and Q2 is switched on, ($V_A$–$V_B$)=–1.8V2 (ignoring the voltage drop through reverse diode D2, which is in the direction of aiding the voltage V2). The result is that the rate of flux change when Q2 is switched on is more than 9 times as great as when Q1 is switched on. In this situation, transistor Q1 will have an "on" time more than 9 times as long as that of Q2. Thus power ((V1-V2)$I_B$) is drawn from the power supplies far longer than power is returned by reverse current through diode D2 and supply V2. This satisfies the intuitive understanding that the power dissipated in the resistor $R_M$ must come from the switched circuit. Even though the high frequency magnetizing current waveform is quite asymmetric, there will be no significant difference in the frequency of switching.

Figure 3:
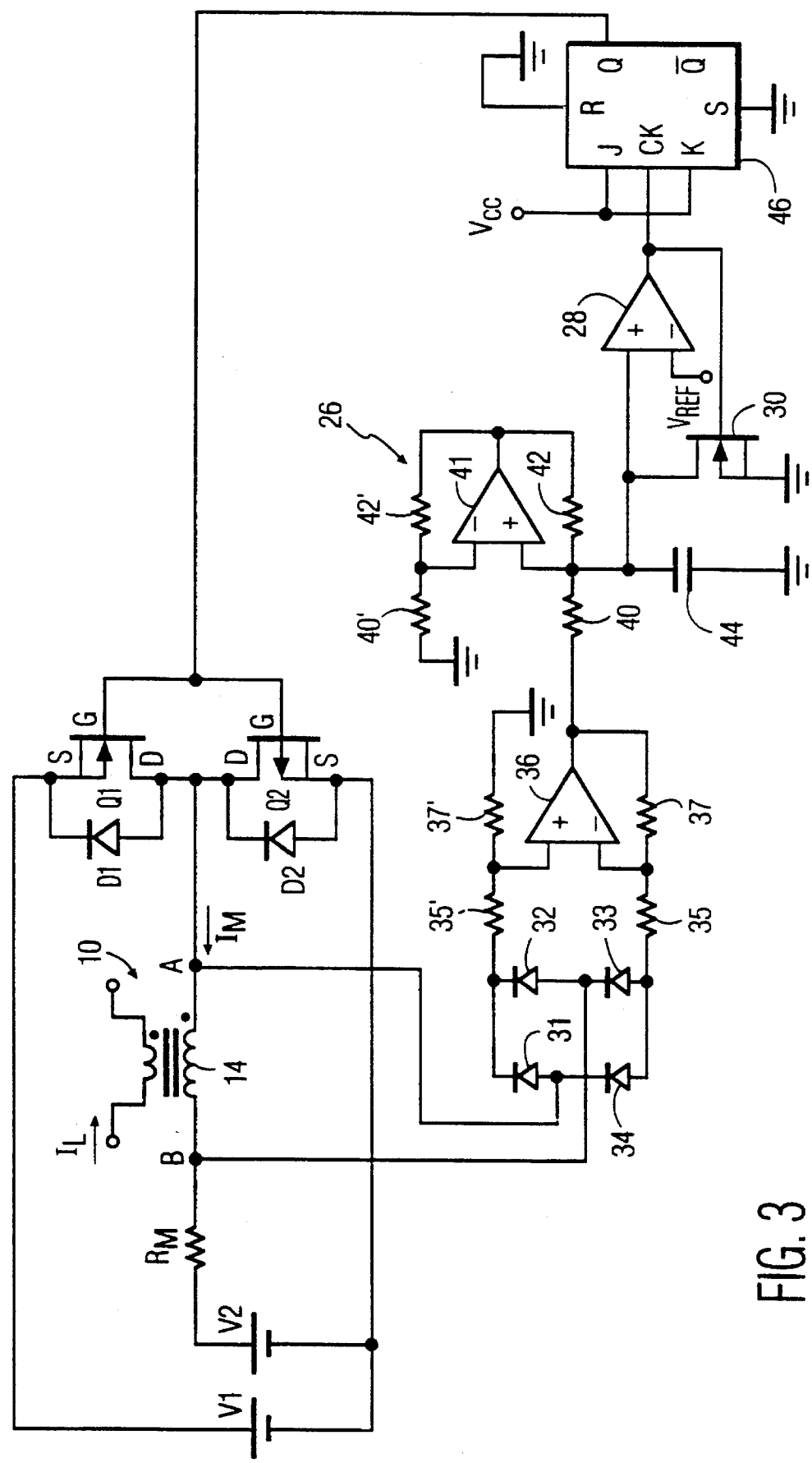
FIG. 3 is a diagram of a practical embodiment of the sensor of FIG. 1.

The circuit of FIG. 3 shows one preferred implementation of the rectifier 24 and integrator 26. Except as described above, all portions of the FIG. 3 circuit are the same as, and operate the same way as, FIG. 1.

The rectifying circuit 24 contains four diodes 31–34 connected in a standard bridge configuration, with the DC outputs being connected through input resistors 35 and 35' to an operational amplifier 36 having a feedback resistor 37 and balancing resistor 37' in the usual connection. The amplifier 36 output is connected to an input resistor 40 of the integrator 26.

The integrator 26 includes an operational amplifier 41 to whose positive input the resistor 40 is connected, and a negative input to which a matching resistor 40' is connected, the other end of the resistor 40' being connected to circuit ground. Feedback resistors 42 and 42' connect from the amplifier output to the positive and negative inputs. An integrating capacitor 44 is connected from the junction of the positive input and the resistor 40, to circuit ground. In this embodiment, the reset circuit is a transistor 30. The bistable circuit is a flip-flop 46, whose output may be directly connected to the gates of the transistors Q1 and Q2.

It will be clear that the operation of the circuit of FIG. 3 is exactly as described with respect to FIG. 1. In analyzing the circuit of FIG. 1, the effect of resistance in the bucking coil 14 was ignored. However, this resistance has a small cumulative effect if the bucking current is substantial, in one direction, over a large number of the high frequency switching cycles. This effect adds a voltage, constant in one direction, to the alternating polarity induced voltage. As a result, the rectifier output is increased during one direction of flux change, and decreased during the other. Switching will occur too soon when the resistive voltage drop is additive, and will be delayed when it is subtractive. During each full high frequency cycle, flux change will be greater in one direction than the other. The flux range will be shifted away from the range of zero to $0.6B_s$, and after a sufficient number of cycles the core will saturate part of the time. This saturation will lead to current spikes in one direction.

Another disadvantage of the circuit of FIG. 3 is drift sensitivity. In theory, one might expect this circuit to be able to operate forever without significant electrical noise or accumulated error. The fact that the integrator 26 operates with the same polarity during each half cycle should very effectively eliminate drift due to any slight bias in the integrator. However, small long-term bias or drift in the output of the integrator 26 may occur, for example, because of slight imbalance in the rectifier circuit 24. If this occurs the flux range may approach and pass 0.4 to 1.0 $B_s$, or −1.0 to −0.4 $B_s$, even in the absence of the bucking winding resistance effect described above. The FIG. 3 circuit will continue to operate, but relatively large magnetizing current pulses will be drawn each time the core starts to saturate, the sharpness of the pulse being, among others, affected by the sharpness of the "knee" of the B-H curve of the magnetic material. These pulses are not representative of the line current, are a form of electrical noise, and are disadvantageous. Filtering the pulses would degrade the response of the sensor to high frequency components of the line current.

Even without saturation, the drift described above has the effect of a small DC error source. To minimize this DC error, it may be desirable to operate normally close to the saturation point, and to provide a means for returning to the desired operating point if saturation is reached.

Figure 4:
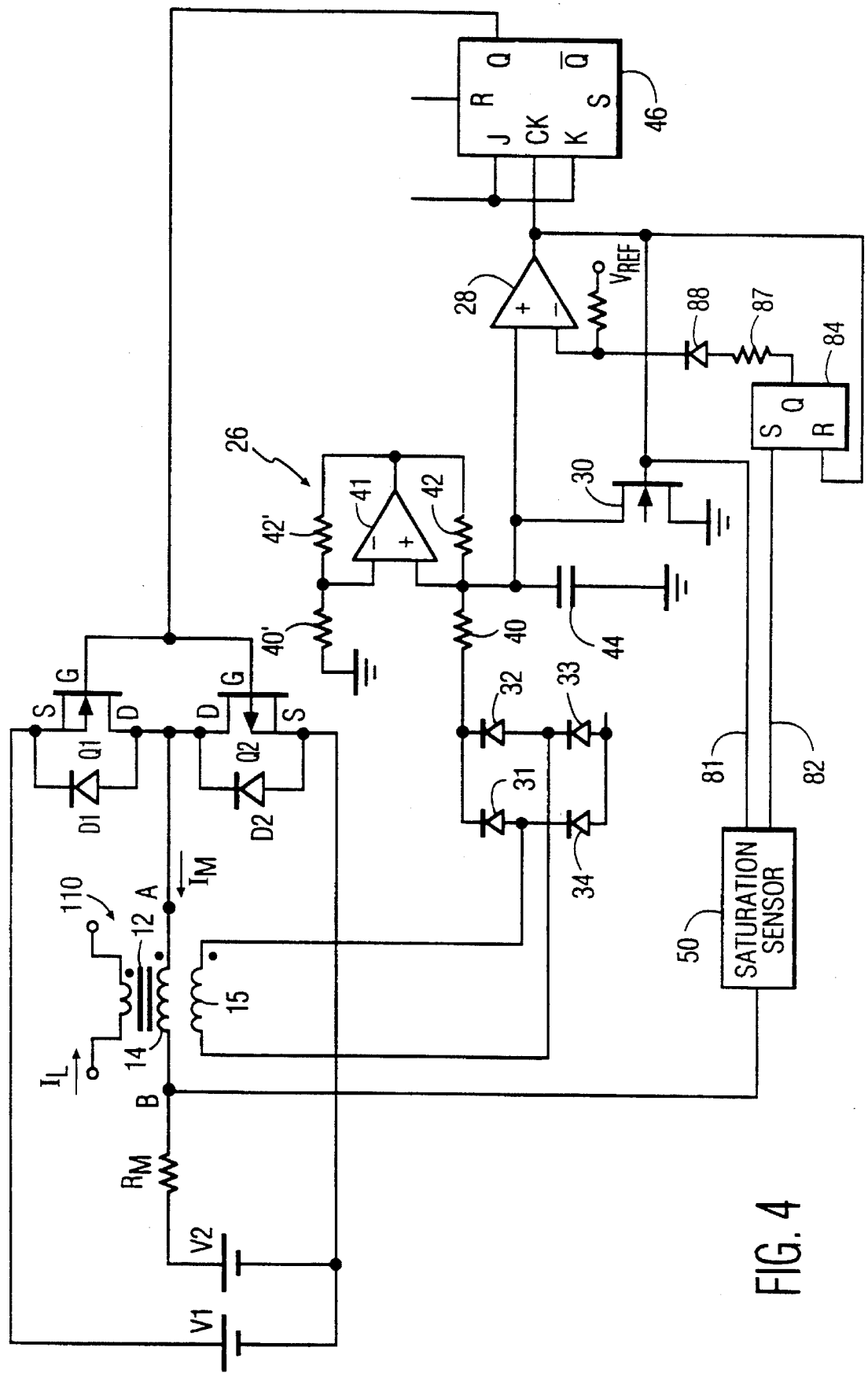
FIG. 4 is a diagram of another sensor according to the invention having a secondary winding and a saturation sensing and correcting circuit.

The circuit of FIG. 4 avoids the effect of resistance in the bucking winding 14 and makes it possible to minimize errors due to drift. Transformer 110 is like transformer 10 except for the addition of a secondary winding 15, which may have a relatively large number of turns of fine wire, to the core 12. This winding carries no current except an infinitesimal, symmetrical reversing current into the high impedance network of the rectifier circuit 124. Because of the separate sensing winding, this signal rectifying circuit is simpler. The secondary winding 15 is connected directly to the input of the bridge rectifier formed by the diodes 31–34. The rectifier output has one end grounded, and the rectified signal is connected directly to the input resistor 40 of the integrator which, because of its high input impedance, does not load the winding significantly. Thus the voltage across the winding 15 is a perfect replica of the flux change in the transformer core 12, independent of the value of the bucking current $I_B$.

The voltage across the measuring resistor $R_M$ is coupled to a saturation sensing circuit 50 having an output 81 and a delayed pulse output 82 isolated from each other. The output 81 is connected to the output of the comparator 28, and the delayed output 82 is connected to the set terminal of a second flip-flop 84. The reset terminal of the flip-flop 84 is connected to the output of the comparator 28. In this variation of the circuit of FIG. 3, the reference voltage for the comparator is provided through a resistor 86. The resistor 86 forms part of a voltage divider including a resistor 87 connected to the flip-flop 84 output Q through a blocking diode 88.

A saturation sensing circuit 50 is connected to the node B between the measuring resistor $R_M$ and the bucking winding 14. Upon sensing core saturation, for example, by detecting the current pulse resulting from saturation, the circuit 50 produces a pulse on output 81 which immediately triggers the flip-flop 46, and resets the integrator output to zero. This causes the voltage drive circuit to switch and the flux starts dropping below the saturation level.

To restore the normal flux operating points, during the half cycle of the magnetizing circuit which was started by the pulse on output 81, the flux change must be greater than the normal amount. To accomplish this, the circuit 50 also produces a delayed pulse on output 82, which sets the second flip-flop 84, causing its output Q to go high after the effects of the pulse on output 81. This in turn raises the reference voltage applied to the comparator 28 through the voltage divider formed by resistors 86 and 87. These resistor values are selected such that the raised reference voltage equals the voltage output the integrator will have when the flux reaches the normal switching value. The comparator 26 produces the usual pulse which triggers the flip-flop 46 to switch the transistor circuit; resets the integrator 28 output; and resets the flip-flop 84. Because of the blocking diode 88 the reference voltage to the comparator is now returned to the normal value $V_{REF}$.

The circuit of FIG. 4 offers the possibility of operating between flux levels approaching saturation in each direction, so that a relatively small amount of drift causes the saturation sensor 50 and flip-flop 84 to restore the flux operating range to be centered about zero. For example, it may be desirable to operate with flux varying between ±0.8 $B_s$. This is accomplished simply be choosing a value $V_{REF}$ which corresponds to a flux change of 1.6 $B_s$ since the previous switching. This manner of operating minimizes the dead band of DC error.

The higher value of $V_{REF}$ will allow saturation during the initial half cycle after the sensor is energized. Any electromagnetic interference relating to this predictably occurring pulse may be acceptable; if it is undesirable, a circuit can be added which reduces the reference voltage to half normal for that first half cycle only.

Figure 5:
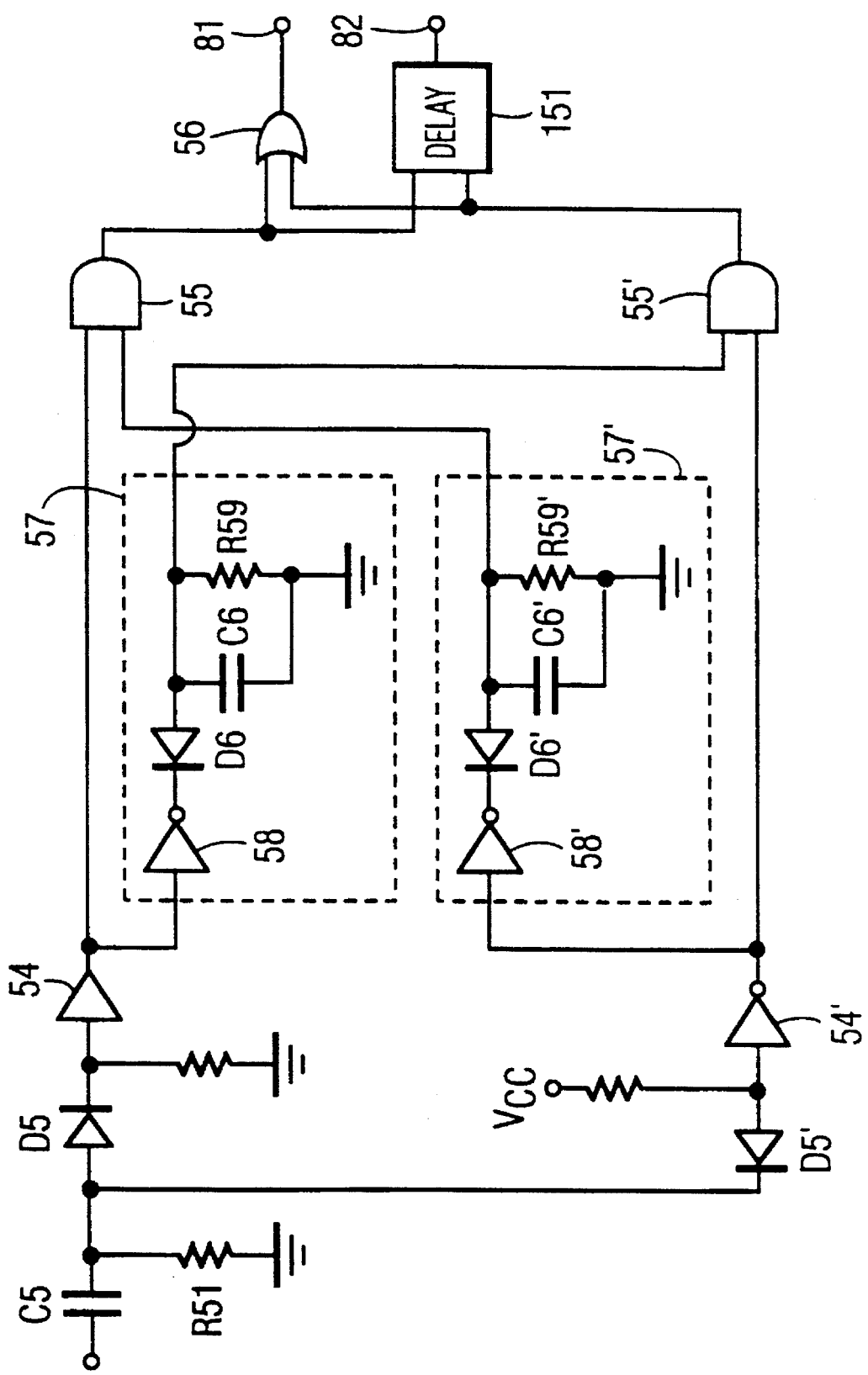
FIG. 5 is a simplified schematic diagram of a saturation sensing circuit.

The circuit of FIG. 5 shows one possible saturation sensor. A low value capacitor C5 and a resistor R51 form a differentiator which will have a negligible output under normal conditions of high frequency switching between flux values of $+B_m$ and $-B_m$, including drift to a situation in which the core is nearly saturated just before switching occurs. Diodes D5 and D5' respectively pass the leading edges of positive and negative pulses to resistors R52 and R52'. Respective buffer amplifier 54 and inverting buffer amplifier 54' pass the resulting pulse to respective AND gates 55 and 55', whose outputs are combined in OR gate 56 to form the output 81 of the saturation sensor. To prevent a response to the trailing edge of the magnetizing current pulse occurring after saturation is reached, each buffer amplifier output is also coupled to the second inputs of the other AND gate 55' and 55 respectively, through respective inhibit circuits 57 and 57'. Each inhibit circuit includes an inverting amplifier 58 (58')coupled through a reverse polarity diode D6 (D6') to the second input of the relevant AND gate, and a parallel capacitor C6 (C6') and resistor R59 to ground, to prevent the second input of the AND gate from being enabled until after the effects of the saturation pulse have died away.

To provide a delayed pulse as output 82, the AND gates 55 and 55' outputs are also connected to a delay circuit 151 which provides a pulse immediately after the output pulse 81. This might, for example, provide sufficient delay by sensing the trailing edge of the pulses from the AND gates 55 or 55', and inverting these. It is important merely that the set pulse to the second flip-flop 84 be provided after the reset pulse has ended, and before the integrator voltage has risen to the normal value $V_{REF}$.

Figure 6:
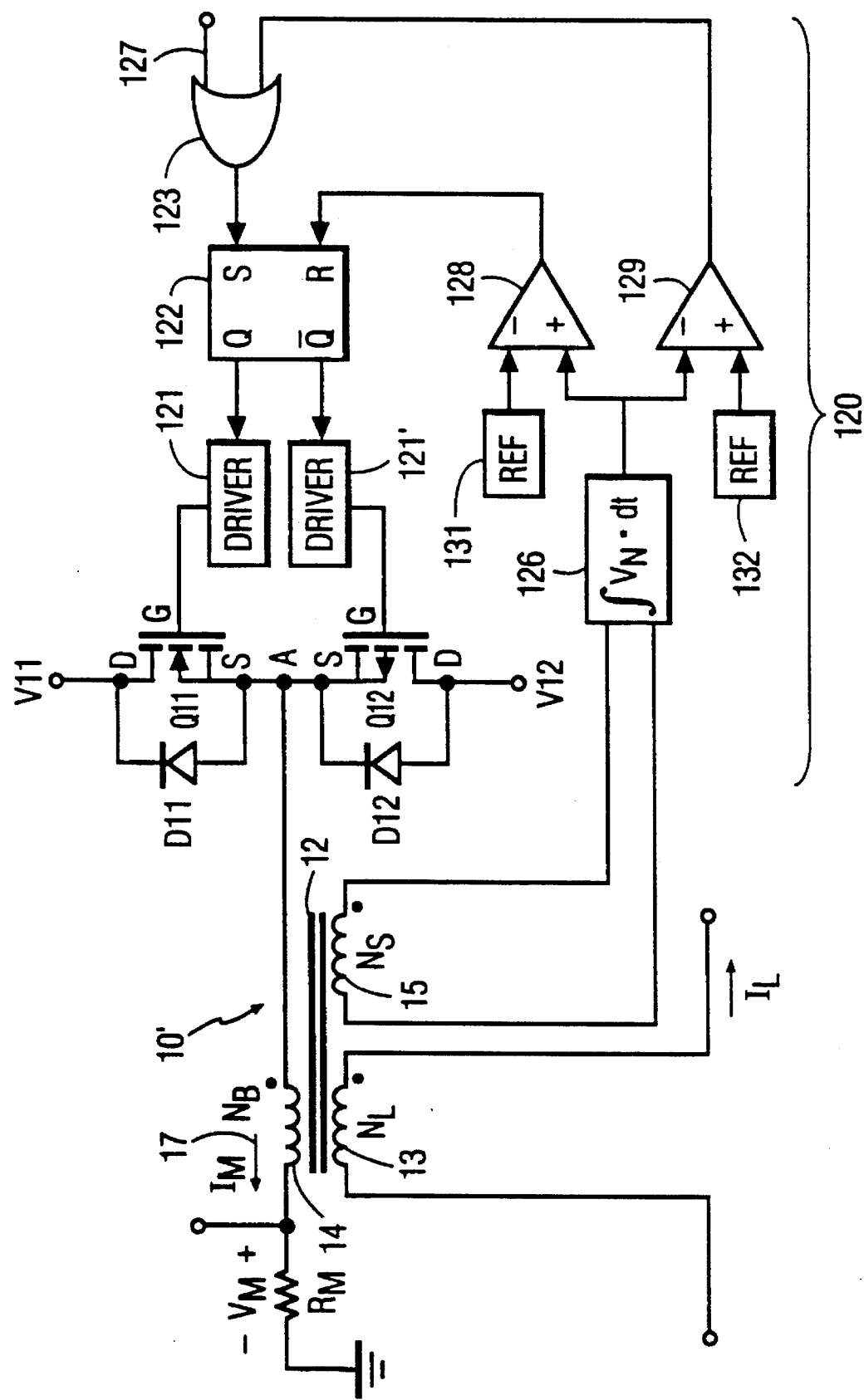
FIG. 6 is a diagram of a sensor having balanced power supplies.

FIG. 6 shows another embodiment, having balanced power supplies, and inherently having the same value of flux, in first one direction and then the other, at the instant of switching. The transformer 10' is identical to that of FIG. 3. The measuring resistor $R_M$ is connected in series with the bucking winding 14, but has the other end connected to circuit ground. The current $I_M$ flows in series through the measuring resistor $R_M$ and a sensing/driving circuit 120 which includes a pair of field-effect transistors Q11 and Q12, which each include a respective reverse diode D11 and D12. The source terminals S of the transistors Q11 and Q12 are connected to the bucking winding at a node A1. The drain terminals of the transistors are respectively connected to positive and negative voltage sources V11 and V12. The respective gate terminals of the transistors are connected to balanced driver circuits 121 and 121' which receive control signals from the output terminals Q and $\overline{Q}$ of a flip-flop 122. The set input of the flip-flop is connected to the output of an OR gate 123, and the reset input is connected to the output of a comparator 128. A second comparator 129 has its output connected to one of the inputs to the OR gate 123, while the other input to the OR gate is connected to a start signal line 127.

An integrator 126 has input terminals connected to the secondary winding 15, and an integrator output connected to the positive input of comparator 128 and the negative input of comparator 129. The negative input of comparator 128 is connected to a positive-flux reference voltage source 131, and the positive input of comparator 129 is connected to a negative-flux reference voltage source 132.

Comparing the operation of this circuit with FIGS. 1, 3 and 4, it will be seen that, even in the first cycle of operation, the flux rises to a value $B_M$ (of either polarity) as the integrator output rises to the reference voltage of one of the comparators. Switching occurs, and the integrator output then falls to zero in synchronization with a reduction of flux to zero, and each then rises in the other direction. The integrator output is never reset. This embodiment has the additional advantage that the measuring resistor conveniently has one end grounded.

EXAMPLE

A current sensor for an electrical circuit breaker has a line current coil whose number of turns provides a maximum magnetomotive force of 100 ampere turns (rms). The bucking coil has 1000 turns, so that the maximum measuring current is 0.100 amp. The core has a cross section and circumferential length such that an unbalanced current of about 0.5 ma will drive the core to approximately 60% of the saturation flux level.

For sensing the changing flux in the core, the secondary winding has a number of turns which provides a peak voltage of about 15 volts when the circuit oscillates at about 50 kHz.

Other Embodiments

It will be clear to those of ordinary skill that many other embodiments are feasible within the scope of the invention. For example, the saturation detector shown in FIG. 5 is relatively complex. Depending on the operating characteristics of the basic sensing circuit, especially the transformer, a simpler or totally different circuit for sensing saturation may be satisfactory. The transistor drive circuit may be constructed in ways which are cheaper and simpler but less well balanced, because overall circuit operation is affected more by the sensing portion of the circuit, which effectively measures the core flux level to ensure that switching occurs at the correct instant, than by the exact character of the voltage switching.

The use of a secondary coil may be dispensed with, in a balanced integrator and driver circuit such as FIG. 6, just as in FIG. 1, with the same advantage of reduced transformer cost, but subject to cumulative error if bucking winding resistance is significant, or line current components change polarity too slowly compared with the switching frequency.

The value of the switching frequency is not critical, nor is its ratio to line frequency. In general, of course, higher switching frequencies allow the use of smaller cores; but if high line currents are to be measured, the core opening must be sufficient to allow for one or more turns of line conductor and, in some cases, a substantial thickness of conductor insulation. The ratio of turns between bucking winding and line winding also represents a trade-off, as does the selection of the value of the measuring resistor. If accurate sampling of very small high frequency components in the line current is desired, of course, the switching frequency should be higher than the components of interest; for example, twice as high.

What is claimed is:

1. A device for non-contacting measurement of current in a line, comprising:

a high permeability core, a line current coil, having at least one turn on said core, for carrying the line current to be measured, a bucking coil on said core, means for passing a measuring current through said bucking coil that is, at least in part, determined by said line current, and means for controlling said measuring current to maintain flux through said core below a saturation flux value.

2. A device as claimed in claim 1, characterized in that said means for controlling includes means for sensing a signal related to a change of flux in said core, and means, responsive to said means for sensing, for changing a magnetizing current flowing through said bucking coil.

3. A device as claimed in claim 1, characterized in that said means for controlling includes:

means for sensing a signal related to a change of flux in said core, means for integrating said signal to produce a flux-equivalent signal, and means, responsive to said flux-equivalent signal having a value equal to a predetermined limit, for changing a magnetizing current flowing through said bucking coil.

4. A device as claimed in claim 3, characterized in that said means for changing comprises a switching circuit for alternatively applying one of two different voltages to said bucking coil, said voltages having values respectively tending to cause current to flow through said bucking coil in one direction or an opposite direction.

5. A device as claimed in claim 4, characterized in that said means for controlling causes said switching circuit to switch at a frequency at least twice that of the highest frequency component of said line current which is to be measured.

6. A device as claimed in claim 4, characterized in that said means for controlling further includes second means for sensing if flux in said core reaches a saturation flux value, and for changing the timing of one cycle of switching to cause flux to alternate between values less than said saturation flux value in the two directions.

7. A device as claimed in claim 3, characterized in that said means for controlling further includes means for rectifying said signal related to a change of flux in said core, and said means for integrating integrates the rectified signal.

8. A device for non-contacting measurement of current in a line, comprising:

a high permeability core, a line current coil, having at least one turn on said core, for carrying the line current to be measured, a bucking coil on said core, a sensing coil for sensing change of flux in said core, a switching circuit for alternatively applying first or second different voltages to said bucking coil, said voltages having values respectively tending to cause a measuring current to flow through said bucking coil in first or second opposite directions, means, connected to said sensing coil, for causing said switching circuit to switch to the other of said different voltages when the change of flux equals a given percentage of the change between the saturation flux values.

9. A device as claimed in claim 8, characterized in that said means for causing comprises, means for integrating a signal derived from said sensing coil to produce a flux-equivalent signal.

10. A device as claimed in claim 9, further comprising means for receiving a flux-change signal from said sensing coil, and for rectifying said flux-change signal to form a rectified signal, wherein said means for integrating integrates the rectified signal.

11. A device as claimed in claim 10, further comprising comparator means connected to receive said integrator output for comparing said integrator output with a first reference voltage and a second reference voltage higher than said first reference voltage, and providing a high limit signal when said integrator output equals said second reference voltage and a low limit signal when said integrator output equals said first reference voltage, a bistable circuit receiving said high and low limit signals, and arranged to maintain a first output condition after receiving said low limit signal and until receipt of said high limit signal, and to maintain a second output condition after receiving said high limit signal and until receipt of said low limit signal, and means for switching said switching circuit responsive to said output conditions of said bistable circuit.

12. A device as claimed in claim 9, further comprising comparator means connected to receive said integrator output for comparing said integrator output with a first reference voltage and a second reference voltage higher than said first reference voltage, and providing a high limit signal when said integrator output equals said second reference voltage and a low limit signal when said integrator output equals said first reference voltage, a bistable circuit receiving said high and low limit signals, and arranged to maintain a first output condition after receiving said low limit signal and until receipt of said high limit signal, and to maintain a second output condition after receiving said high limit signal and until receipt of said low limit signal, and means for switching said switching circuit responsive to said output conditions of said bistable circuit.

13. A device for non-contacting measurement of current in a line, comprising:

a high permeability core, a line current coil, having at least one turn on said core, for carrying the line current to be measured, a bucking coil on said core, a sensing coil for sensing change of flux in said core, an integrator, having an integrator output, for integrating a signal derived from said sensing coil, comparator means connected to receive said integrator output for comparing said integrator output with a first reference voltage, and to provide a high limit signal when said integrator output equals said first reference voltage, a bistable circuit receiving said high limit signal, and changing an output condition upon receipt of said low limit signal, a field effect transistor switching circuit for alternatively applying voltages of opposite polarity to said bucking coil at approximately a predetermined high frequency, for passing a measuring current therethrough having a magnetizing current component at said high frequency, and means for switching said switching circuit responsive to output conditions of said bistable circuit.

14. A device as claimed in claim 13, further comprising means for receiving a flux-change signal from said sensing coil, and for rectifying said flux-change signal to form a rectified signal, wherein said means for integrating integrates the rectified signal.

15. A device as claimed in claim 14, further comprising circuit initiation means for comparing the integrator output, during a first period of integration, with a voltage less than said first reference voltage, whereby flux in said core alternates between values in opposite directions during subsequent periods of integration.

16. A device as claimed in claim 14, further comprising second means for sensing if flux in said core reaches a saturation flux value, and for temporarily changing said first reference voltage to cause flux to alternate between values less than said saturation flux value.

17. A device as claimed in claim 13, characterized in that said comparator means further compares said integrator output with a second reference voltage approximately equal but opposite in polarity to said first reference voltage, and provides a low limit signal when said integrator output equals said second reference voltage, and said bistable circuit changes condition responsive to receipt of said limit signals, whereby flux in said core alternates between approximately equal values in opposite directions.

18. A device as claimed in claim 13, characterized in that said switching circuit comprises two complementary field effect transistors having respective first current-carrying terminals connected to each other and to a first connection to said bucking coil, respective second current-carrying terminals respectively connected to a source of DC voltage, and first and second driver circuits each connected between a respective one of the transistor gate electrodes and said bistable circuit, and the device further comprises a measuring resistor connected between a second connection to said bucking coil different from said first connection, and a common node between said positive and said negative voltage supply.

19. A device as claimed in claim 18, further comprising means for setting said bistable circuit to a predetermined one of said conditions upon application of electrical power to said switching circuit.

20. A device as claimed in claim 18, further comprising second means for sensing if flux in said core reaches a saturation flux value, and for changing the timing of one cycle of switching to cause flux to alternate between values less than said saturation flux value in the two directions.

21. A device as claimed in claim 1 wherein said high permeability core only has the line current coil and the bucking coil magnetically coupled thereto.

22. A device as claimed in claim 1 wherein said controlling means controls the measuring current so as to maintain the flux through said core at value between 60 percent to 80 percent of the core saturation flux value.

23. Apparatus for sensing a current in a line comprising:

a transformer having a core with a primary winding for conducting the line current to be sensed and a bucking winding, a transistor switching circuit for supplying a measuring current to said bucking winding, and means coupled to said bucking winding for controlling said measuring current to maintain flux through said core below a saturation flux value, said controlling means comprising means for sensing a change of flux in said core and for adjusting a bucking current flowing in said bucking winding as a function of the line current flowing in said primary winding.

24. The apparatus as claimed in claim 23 wherein said means for sensing and adjusting provides pulse width modulation of the transistor switching circuit for adjusting the bucking current in the bucking winding.

25. The apparatus as claimed in claim 23 wherein said means for sensing and adjusting supplies a feedback signal to said bucking winding via the transistor switching circuit and which is determined by the line current flowing in said primary winding.

* * * * *